United States Patent
Casey

(10) Patent No.: US 6,649,539 B1
(45) Date of Patent: Nov. 18, 2003

(54) SEMICONDUCTOR CONTACT FABRICATION METHOD

(75) Inventor: David Neil Casey, Lancashire (GB)

(73) Assignee: Zetex PLC, Chadderton Oldham (GB)

( * ) Notice: Subject to any disclaimer, the term of this patent is extended or adjusted under 35 U.S.C. 154(b) by 0 days.

(21) Appl. No.: 09/445,109

(22) PCT Filed: Apr. 1, 1999

(86) PCT No.: PCT/GB99/00858

§ 371 (c)(1),
(2), (4) Date: Jul. 9, 2001

(87) PCT Pub. No.: WO99/52131

PCT Pub. Date: Oct. 14, 1999

(30) Foreign Application Priority Data

Apr. 3, 1998 (GB) .............................................. 9807115
Feb. 23, 1999 (GB) .............................................. 9903972

(51) Int. Cl.$^7$ .......................................... H01L 21/469
(52) U.S. Cl. ..................... 438/778; 438/645; 438/667; 438/778; 438/244; 438/246; 438/249
(58) Field of Search ........................... 438/778, 96, 97, 438/98, 149, 244, 246, 249, 760, 667, 645

(56) References Cited

U.S. PATENT DOCUMENTS 6,210,991 B1 * 4/2001 Wenham et al. ............... 438/97

* cited by examiner

Primary Examiner—David Nelms
Assistant Examiner—Reneé R Berry
(74) Attorney, Agent, or Firm—Morrison & Foerster LLP

(57) ABSTRACT

A method for reducing damage to a semiconductor structure resulting from migration of constituents of a first component part (3) of the structure into a subsequently deposited second component part (8) of the structure which makes contact with a surface of the first component part (3). A third component part (10) of the structure is deposited before the second component part (8), the third component part (10) being positioned so as to be contacted by the second component part (8) adjacent the said surface of the first component part (3). The third component part (10) has a composition such that it acts as a donor of constituents (12) to the second component part. The donor constituents (12) migrate into the second component part (8) when the second component part (8) is deposited and reduce the migration of constituents (11) of the first component part (3) into the second component part (8). If the first component part (3) is silicon, the third component part (10) may be polysilicon. The invention enables the use of a pure material, for example pure aluminium, without exposing the first component part (3) to damage as a result of migration of constituents of the first component part (3) into the aluminium.

8 Claims, 7 Drawing Sheets

Figure 1:
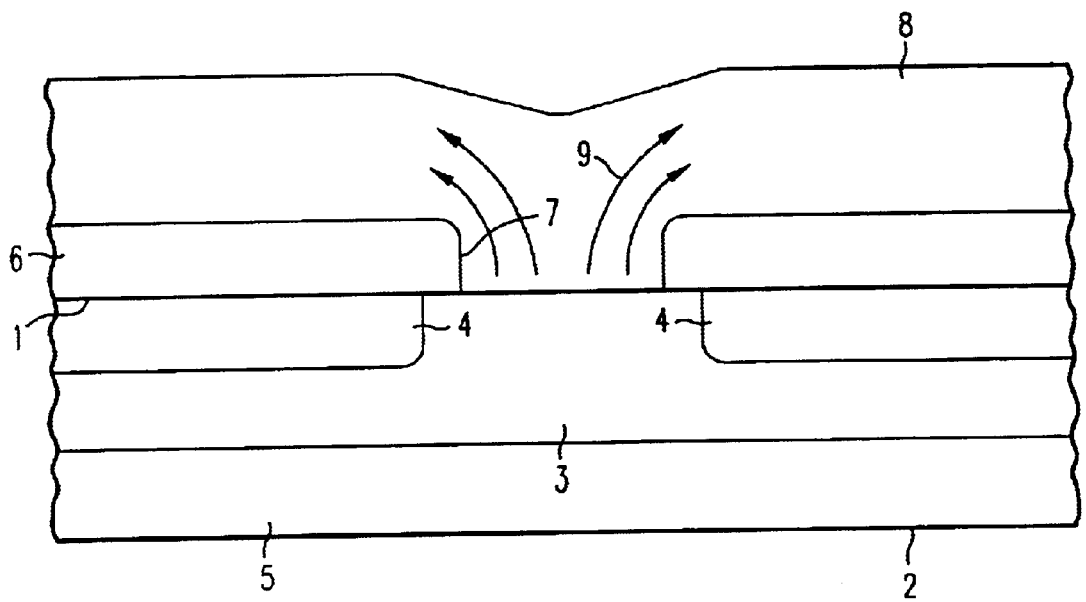

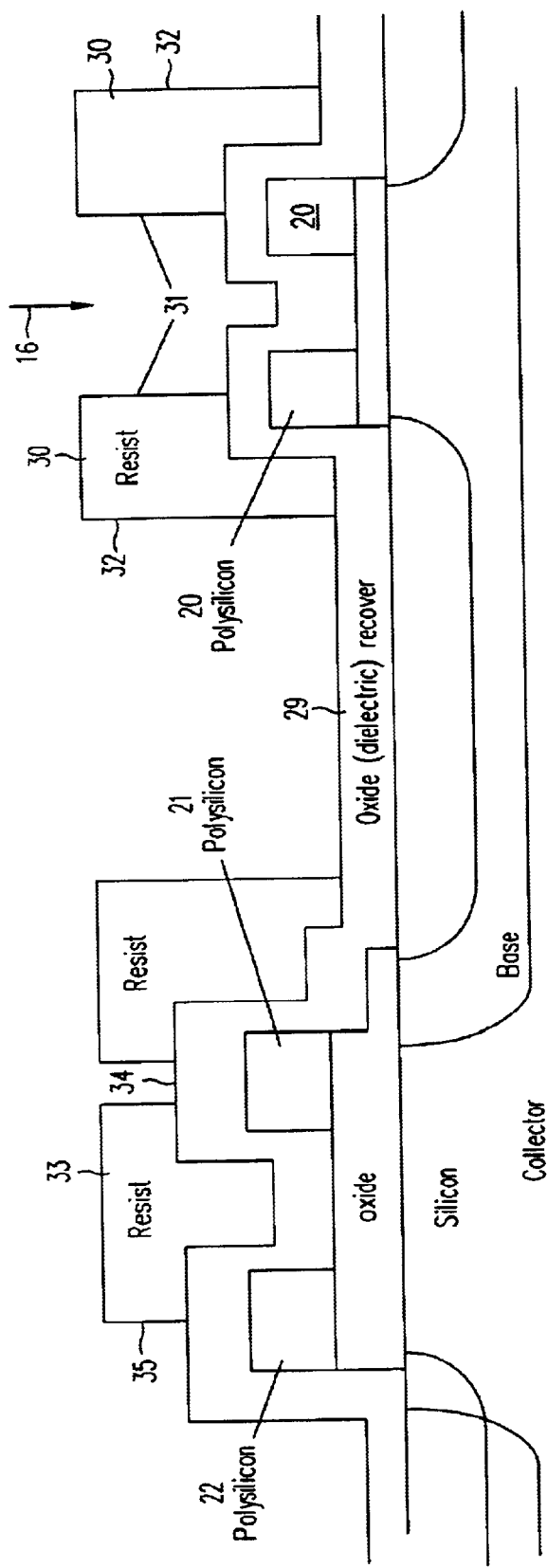
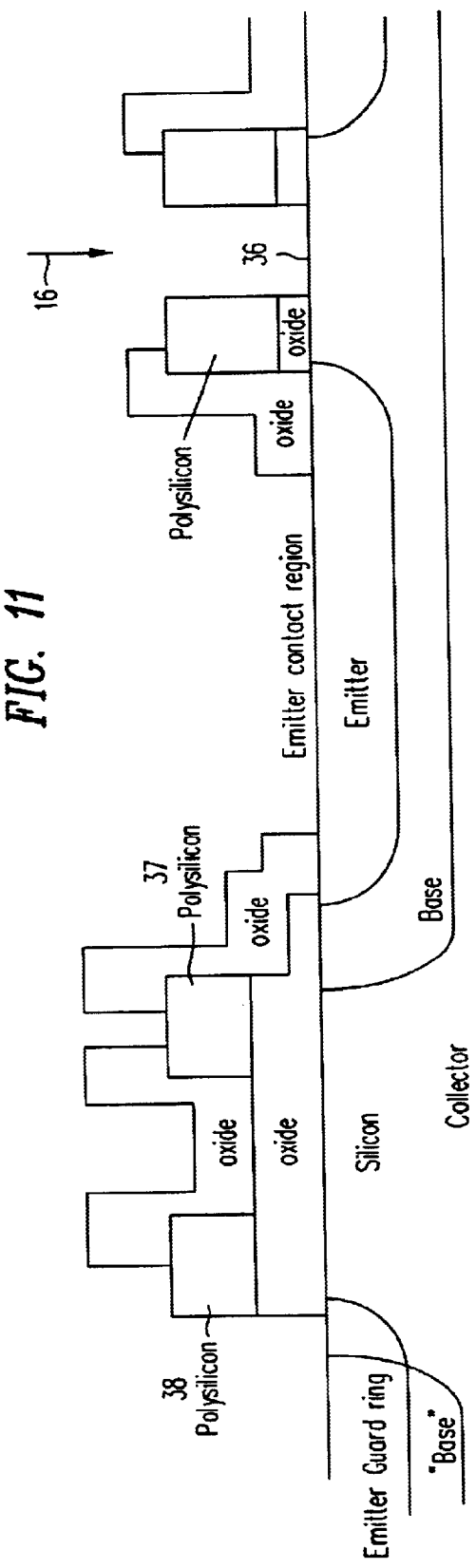
FIG. 11
FIG. 12

SEMICONDUCTOR CONTACT FABRICATION METHOD

The present invention relates to a method for fabricating a semiconductor structure, and in particular to a method for reducing damage to a semiconductor structure resulting from migration of constituents of a first component part of the structure into a subsequently deposited second component part of the structure which makes contact with the surface of the first component part.

It is well known that if a material such as pure aluminium is deposited on for example a silicon substrate constituents of the silicon substrate migrate into the pure aluminium and vice versa. If the contact area between the aluminium and the silicon is relatively large and the deposited aluminium is relatively thin, the migration of silicon material into the aluminium does not result in substantial damage to the silicon surface. If however the contact area is relatively small as compared with the volume of the aluminium substantial damage can be caused to the silicon surface. This can occur where for example aluminium is used to make contact with a silicon surface through a hole formed in an insulating layer formed over the silicon surface. The problem has become more severe as the minimum size of individual semiconductor structure features has reduced, for example the minimum size of a through hole formed in an insulating layer.

It is known to address this problem by pre-doping a material such as aluminium before it is deposited. Unfortunately the use of pre-doped aluminium is less advantageous as compared with the used of pure aluminium with the exception of the damage that can result to an underlying silicon surface of relatively small area.

It is an object of the present invention to obviate or mitigate the problems outlined above.

According to the present invention, there is provided a method for reducing damage to a semiconductor structure resulting from migration of constituents of a first component part of the structure into a subsequently deposited second component part of the structure which makes contact with a surface of the first component part, wherein a third component part of the structure is deposited before the second component part, the third component part being positioned to be contacted by the second component part adjacent the said surface, and the third component part has a composition such that it acts as a donor of constituents to the second component part the migration of which into the second component part reduces the migration of constituents of the first component part into the second component part.

The first component part may be silicon, and the third component part may be polysilicon. The second compartment part may be pure aluminium.

In one embodiment of the invention, the first component part defines an upper surface a portion of which defines the said surface of the first component part, a layer of insulating material is formed on the upper surface, a through hole is formed in the layer of insulating material over the said portion of the first component part, a layer of the third component part is formed on the layer of insulating material around the through hole, and the second component part is formed as a layer extending over the second component part and into the through hole.

Figure 2:
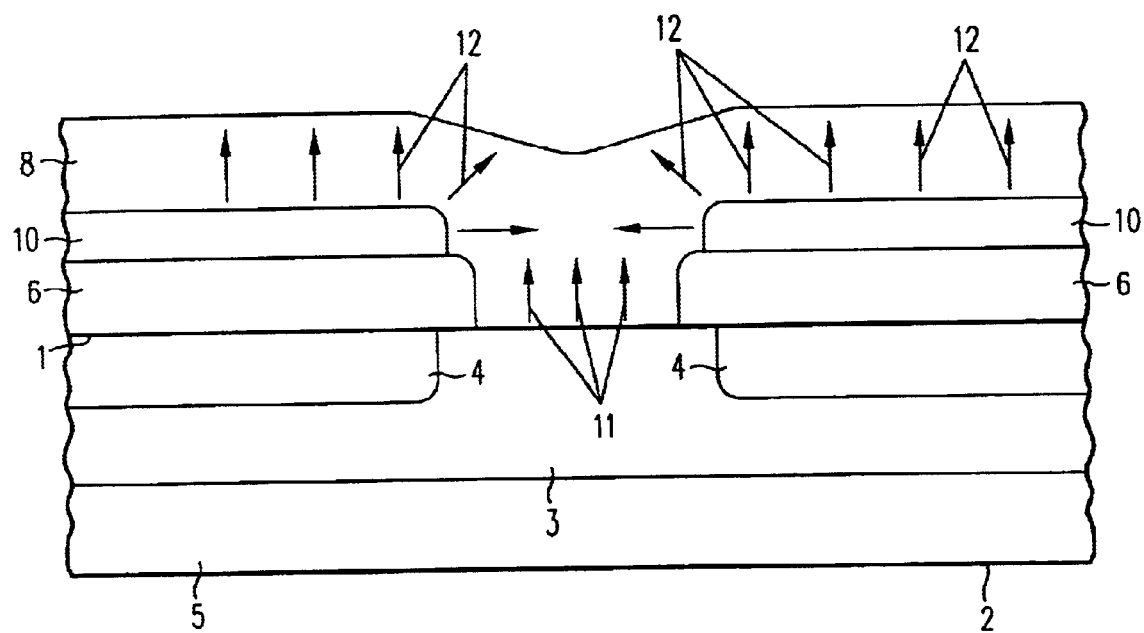

An embodiment of the present invention will now be described, by way of example, with reference to the accompanying drawings, in which:

FIG. 1 is a schematic representation of a conventional junction structure in a prior art semiconductor device; and FIG. 2 is a schematic representation of a function structure similar to that of FIG. 1 but formed using a method which is an embodiment of the present invention; and FIGS. 3 to 13 illustrate successive steps in a process for forming a device using a method in accordance with the present invention.

Referring to FIG. 1, the illustrated structure is a conventional bipolar junction arrangement. A silicon substrate has an upper surface 1 and a lower surface 2. The substrate is initially of a first conductivity type. A region 3 of a second conductivity type is then formed by for example diffusing a dopant into the upper surface 1. A region 4 of the first conductivity type is then formed in the region 3 by for example implanting a dopant through the upper surface 1. In the illustrated case the region 4 is annular. Thus the substrate comprises an emitter region 4 of the first conductivity type, a base region 3 of the second conductivity type, and a collector region 5 of the first conductivity type. It will be appreciated that the schematic illustration of FIG. 1 is not to scale and that the spacing between the upper and lower surfaces 1 and 2 is shown very much less than it would be in practice, and that in a practical device the thickness of the collector region 5 may be much greater than the thicknesses of the base and emitter regions.

An oxide layer 6 is formed over the emitter regions 4, a through hole defined by edge 7 being formed in the oxide layer 6 to expose the base region 3 where it extends to the surface 1. An aluminium layer is then deposited over the oxide layer 6 and contacts the surface 1 where it is exposed inside the edge 7 of the oxide layer.

A relatively narrow portion of the base region 3 extends beneath the oxide layer outside the edge 7. It is important that the electrical characteristics of this annular region are not compromised given that in operation of the device a potential difference will be established between the conductive layer 8 and the emitter region 4. It has been found that if pure aluminium is used for the conductive layer 8, after the aluminium is deposited silicon is caused to migrate from the base region 3 into the body of the aluminium layer 8 as indicated by arrows 9 and vice versa. The silicon structure adjacent the portion of the surface 1 which is exposed to the aluminium layer 8 is as a result degraded to such an extent that the functionality of the device can be compromised. In particular, unacceptable leakage currents or even a short circuit can be established through the base region underlying the oxide layer 6 between the emitter region 4 and the oxide edge 7. This is a known problem which has been addressed in conventional structures by pre-doping the aluminium used for the layer 8 with silicon such that when the pre-doped aluminium layer 8 is deposited there is little or no tendency for silicon to migrate from the base region 3 into the conductive layer 8.

The conventional use of a pre-doped aluminium conductive layer is not ideal as at least in certain applications the characteristics of aluminium pre-doped with silicon are less advantageous than pure aluminium. The present invention enables these disadvantages to be obviated or mitigated.

Referring to FIG. 2, a structure is illustrated which is in accordance with the present invention and which is functionally equivalent to the conventional structure illustrated in FIG. 1. Where appropriate the same reference numerals are used in FIGS. 1 and 2. In the structure of FIG. 2, the substrate has an upper surface 1 and a lower surface 2 and has formed within it a base region 3, an emitter region 4 and a collector region 5. An oxide layer 6 is formed over the emitter regions 4 and a through hole defined by edge 7 exposes a portion of the base region 3. A conductive layer 8 is deposited so as to make contact with the base region 3.

In contrast to the structure of FIG. 1, a polysilicon layer 10 is deposited over the oxide layer 6, a through hole being formed in the polysilicon layer 10 which registers with the through hole formed in the oxide layer 6. Thus there is no contact between the polysilicon layer 10 and the base region 3. In the arrangement of FIG. 2, the conductive layer 8 is of pure aluminium and thus silicon will migrate into the layer 8. Some silicon will migrate from the base region 3 as indicated by arrows 11 but silicon will also migrate from the polysilicon layer as indicated by the arrows 12. Thus equilibrium will be achieved in the initially pure aluminium layer 8 before there has been a substantial migration of silicon from the base region 3. Damage to the base region 3 is thus very much less than in the case illustrated in FIG. 1 and the functionality of the device is not compromised.

It may be the case that dopant density within the contact opening to the base region will be too low to form an ohmic contact. If this is the case, additional dopant may be introduced into the contact holes by way of for example a shallow surface diffusion to boost the base concentration. This dopant could also overlap into the polysilicon to perform the same function in the polysilicon. Alternatively, the polysilicon could be doped simultaneously with the emitter.

It will be appreciated that silicon-donor materials other than polysilicon could be used to reduce the migration of silicon from the base region 3 in accordance with the present invention. It will also be appreciated that although the invention has been described with reference to a simple bipolar structure the present invention may be used to advantage in any circumstance in which the migration of constituents from one component of a semiconductor structure into another must be minimised.

FIGS. 3 to 13 illustrates successive steps in a process which may be used to form a structure of the type described in general terms with reference to FIG. 2. The process described with reference to FIGS. 3 to 13 forms not only a base contact region such as that described with reference to FIG. 2 but also a guard ring and collector field relief electrode structure (equipotential ring).

Figure 3:
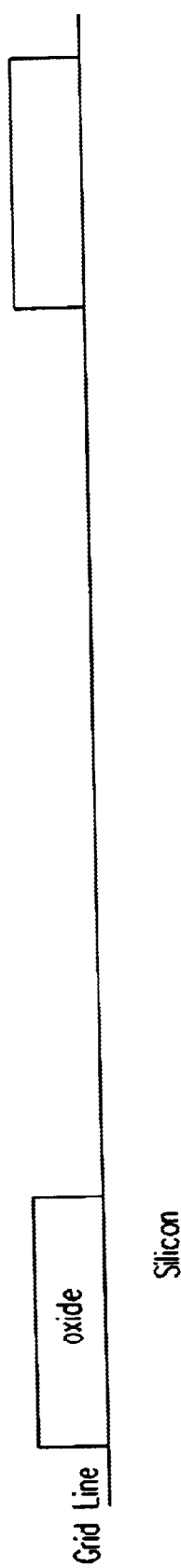

Referring to FIG. 3, a silicon substrate (or a silicon epitaxial layer of the same polarity as and grown on the substrate) has an oxide layer formed upon it which is selectively etched to leave an annular oxide structure which will define the edge of the device.

Figure 4:
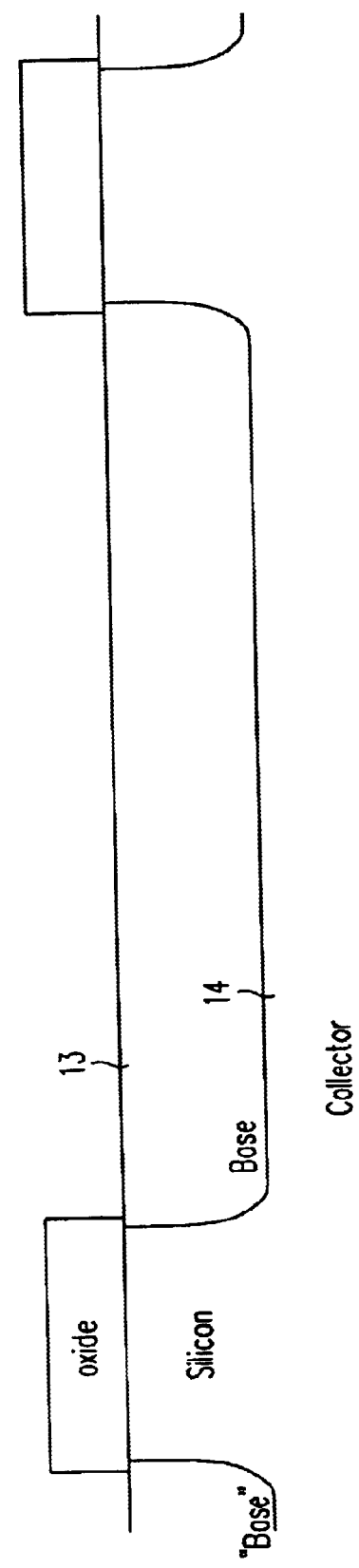

FIG. 4 illustrates the diffusion of a base dopant into the exposed substrate to form a base region 13 which is of the opposite conductivity type to the silicon substrate the body of which forms a collector region 14. The same dopant is introduced on the outside of the oxide structure.

Figure 5:
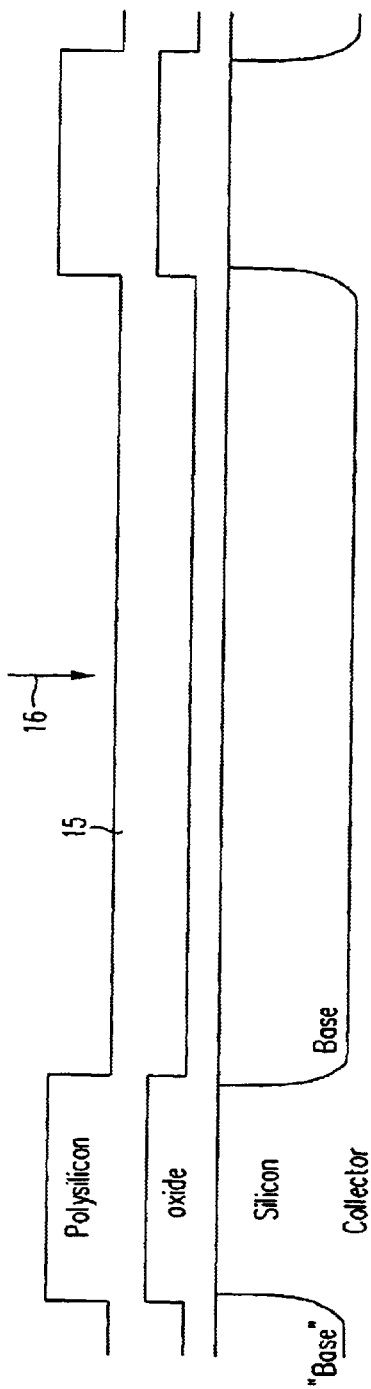

FIG. 5 shows the structure of FIG. 4 after a polysilicon layer 15 has been deposited. FIG. 5 also indicates by arrow 16 the position of a centre line about which the illustrated structure is symmetrical. The same arrow 16 is used in subsequent drawings some of which are drawn to a different scale as compared with FIG. 5.

Figure 6:
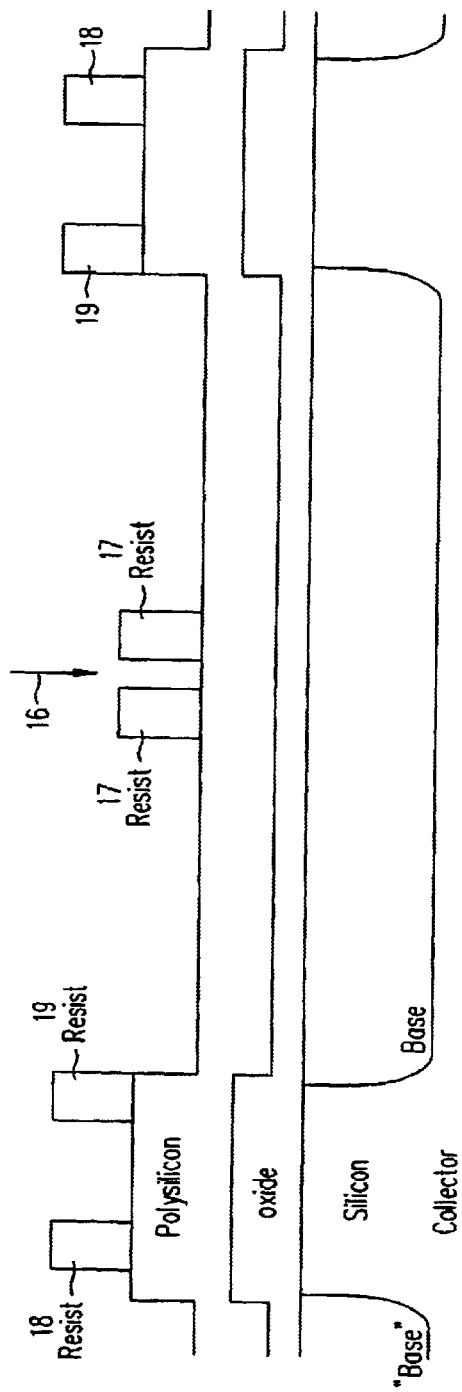

FIG. 6 illustrates the deposition of a ring shaped resist structure 17, the ring structure defining an aperture which in the illustrated example is aligned with the centre line 16. In addition, annular resist structure 18 and 19 are formed on the polysilicon above the oxide structures. The position of the resist structure 17, 18 and 19 define the positions of the self aligned edges of the emitter and contact regions and guard rings.

Figure 7:
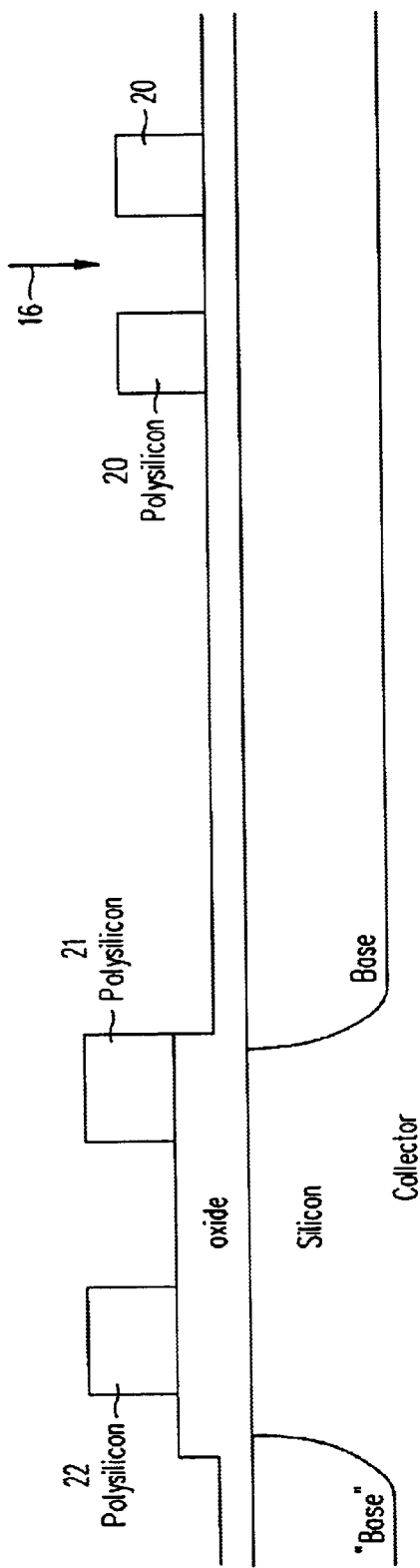

FIG. 7 illustrates the structure of FIG. 6 after the polysilicon not covered by the resist structures 17, 18 and 19 has been etched away without etching away the underlying oxide layer. As a result a ring of polysilicon 20 is formed centrally with annular polysilicon structures 21 and 22 being formed around the periphery of the base region 13.

Figure 8:
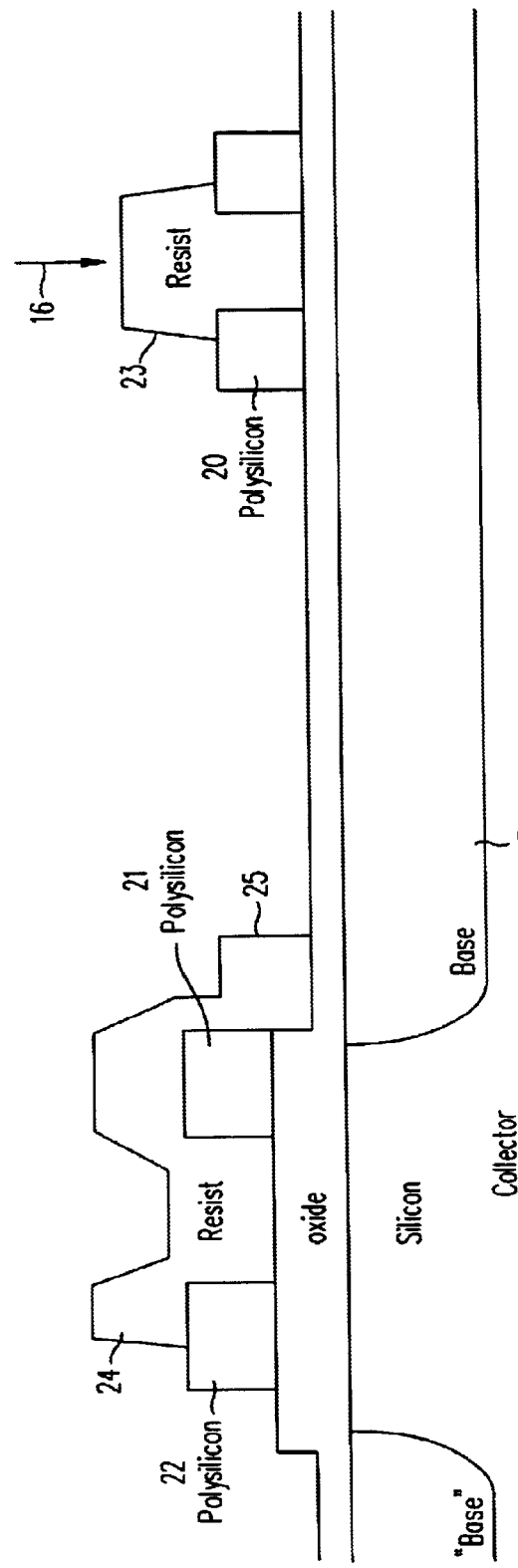

Referring to FIG. 8, a body of resist 23 is deposited so as to block the central aperture defined by the polysilicon ring 20. The alignment of the resist body 23 with the centre line is not critical. All that is required is that the body of resist 23 fully covers the aperture defined in the polysilicon 20 so as to prevent a subsequent processing step having any effect on the structure underlying the aperture in the polysilicon 20. A further body of resist 24 is formed over the polysilicon 21 and 22, the resist body 24 being arranged to fully cover the gap between the polysilicon structures 21 and 22. A radially inner edge 25 of the body of resist 24 overlies peripheral portions of the base region 13.

Figure 9:
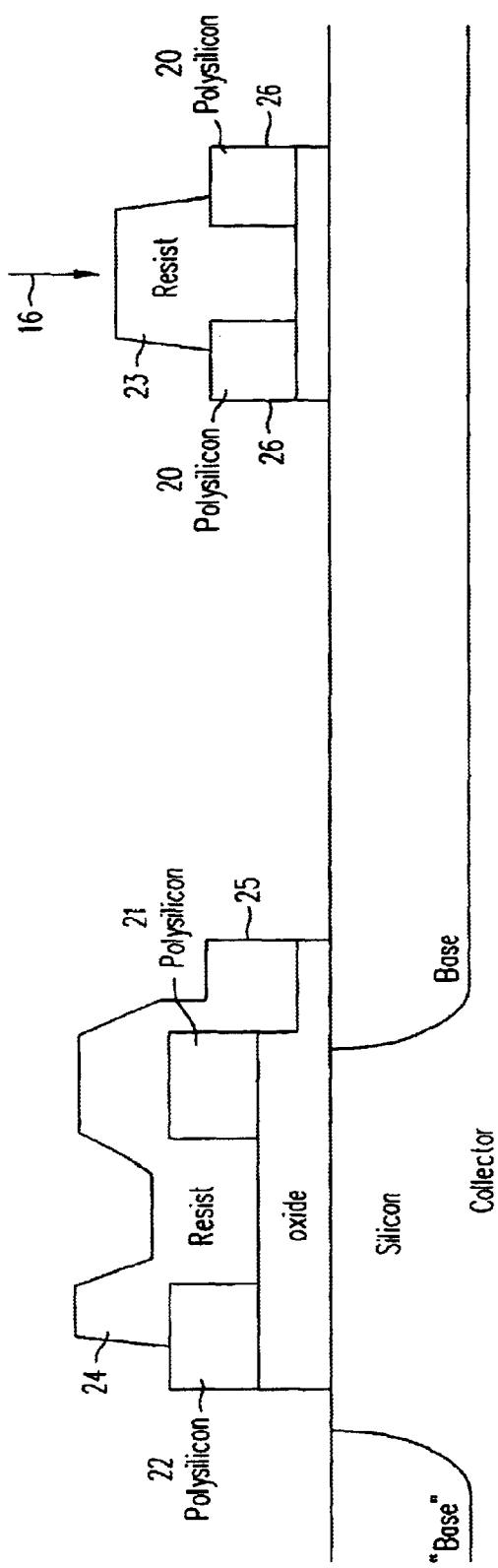

Referring to FIG. 9, the structure of FIG. 8 is etched to remove all those portions of the oxide layer which are not covered either by the polysilicon or the resist bodies 23 and 24. As a result the base region 13 is exposed between the resist edge 25 and an outer edge 26 of the polysilicon body 20.

Figure 10:
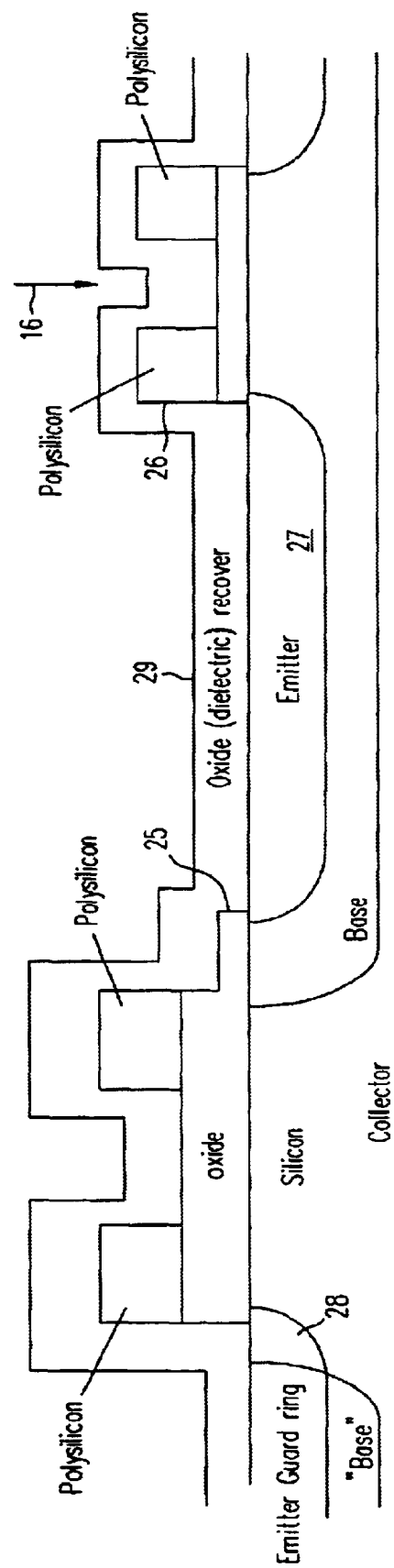

As shown in FIG. 10, an emitter region 27 is diffused or implemented into the exposed base region defined between the edges 25 and 26 and a guard ring 28 is diffused or implanted into the substrate which is radially outside the polysilicon body 22. The emitter is driven in and the structure is covered with oxide (or any other suitable dielectric) to form an oxide layer 29.

Referring to FIG. 11, an annular body of resist 30 generally aligned with the polysilicon ring 20 is deposited over the oxide layer 29. Misalignments between the resist body 30 and the polysilicon 20 are not a problem providing the inner edge 31 of the resist is between the inner or outer edges of the polysilicon ring 20 and the outer edge 32 of the resist is outside the outer edge of the polysilicon ring 20. A resist body 33 is also formed over the polysilicon bodies 21 and 22, the resist body 33 defining apertures 34 preferably only in small areas, e.g. corners of the device. The outer edge 35 of the resist body 33 is radially inside the outer edge of the polysilicon body 22.

FIG. 12 illustrates the structure after oxide not protected by the resist bodies 30 and 33 has been etched away to expose a base contact region 36, a field plate contact region 37 and a collector field relief electrode contact region 38. In FIG. 12 the structure is shown after removal of the resist bodies 30 and 33.

Figure 13:
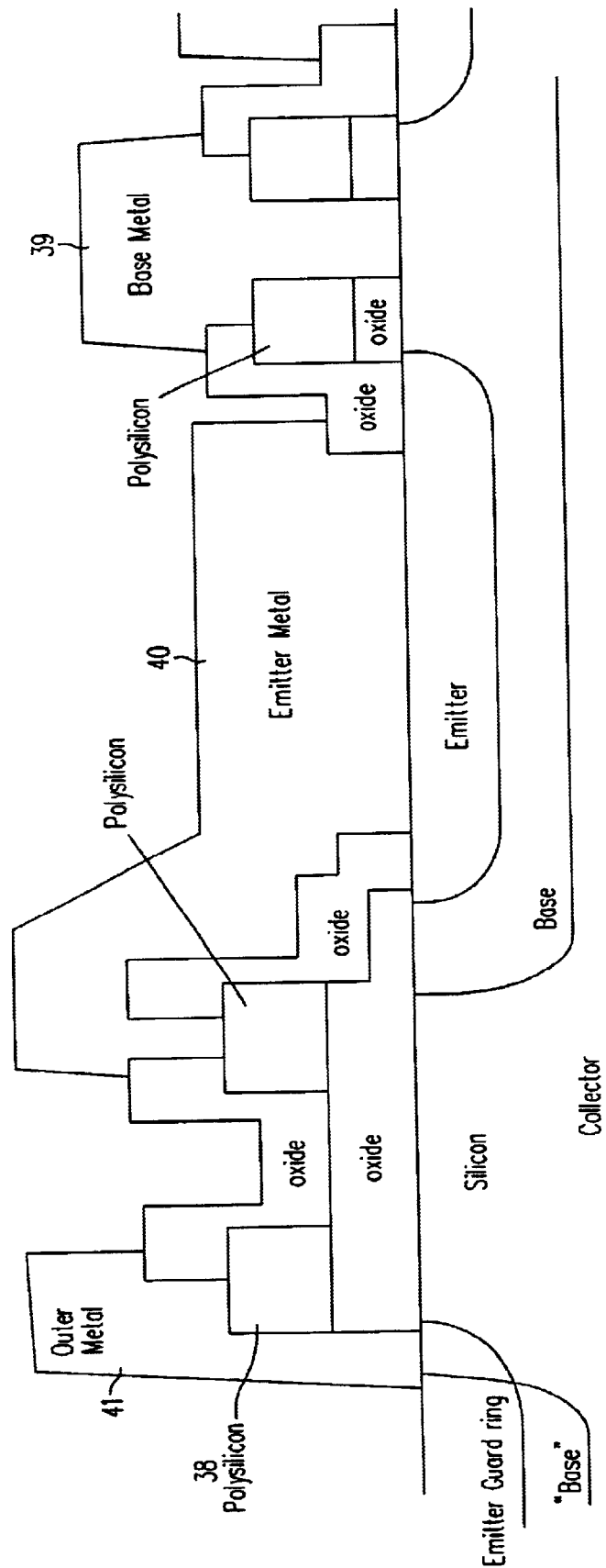

FIG. 13 illustrates the final structure after deposition of a metal body 39 to form a base contact, a metal body 40 to define an emitter contact and a metal short to the collector base field plate (polysilicon), and a metal body 41 to define a metal short for the equipotential ring (polysilicon). Generally the metal body 41 need only be provided in the corners of the device, and interconnects an equipotential ring defined by the polysilicon 38. Portions of the polysilicon equipotential ring 38 not contacted by the metal body 41 may be covered by a densified thick dielectric layer (not shown) applied before formation of the metal body 41.

The above-described embodiment of the present invention enables a relatively small area base contact region to be provided. In the example described the end structure is an NPN bipolar transistor. A typical PNP structure would have an additional photoresist and deposition stage introduced between the process steps represented in FIGS. 10 and 11. It may be advantageous also to include such a stage in NPN structures. It may be advantageous also to include such a stage between the process steps represented in FIGS. 3 and 4, or FIGS. 9 and 10. It should be appreciated however that the process in accordance with the present invention could be applied to other device technologies, for example integrated circuits including CMOS, and bipolar diodes where process step to process step alignment tolerances can be avoided.

The presence of polysilicon adjacent the contact regions provides a sacrificial source of silicon which enables the use of pure aluminium metallisation as opposed to aluminium doped with silicon. In the absence of such a sacrificial source of silicon, the use of pure aluminium would cause lateral damage in the small contact holes as a result of silicon being drawn out of the semiconductor surface during alloying. Junction leakage or failure could result from such damage.

What is claimed is:

1. A method for reducing damage to a semiconductor structure resulting from migration of constituents of a first component part of the structure into a subsequently deposited second component part of the structure which makes contact with a discrete area of a surface of the first component part, wherein a third component part of the structure is deposited before the second component part, the third component part being positioned to be contacted by the second component part around said discrete area of the surface, and the third component part has a composition such that it acts as a donor of constituents to the second component part of the migration of which into the second component part reduces the migration of constituents of the first component part into the second component part.

2. A method according to claim 1, wherein the first component part is silicon.

3. A method according to claim 2, wherein the third component part is polysilicon.

4. A method according to claim 1, wherein the second component part is aluminum.

5. A method according to claim 1 wherein the first component part defines an upper surface a portion of which defines the said surface of the first component part, a layer of insulating material is formed on the upper surface, a through hole is formed in the layer of insulating material over the said portion of the first component part, a layer of the third component part is formed on the layer of insulating material around the through hole, and the second component part is formed as a layer extending over the second component part and into the through hole.

6. A method according to claim 5, wherein the first component part is silicon.

7. A method according to claim 5, wherein the third component part is polysilicon.

8. A method according to claim 5, wherein the second component part is aluminum.

* * * * *